(12) United States Patent
Kuo et al.

(10) Patent No.: US 10,283,388 B1
(45) Date of Patent: May 7, 2019

(54) DETAPING MACHINE AND DETAPING METHOD

(71) Applicant: Taiwan Semiconductor Manufacturing Co., Ltd., Hsinchu (TW)

(72) Inventors: Tsung-Sheng Kuo, New Taipei (TW); Hsu-Shui Liu, Taoyuan (TW); Jiun-Rong Pai, Hsinchu County (TW); Shou-Wen Kuo, Hsinchu (TW); Wen-Chin Kan, Miaoli County (TW); Yang-Ann Chu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/876,225

(22) Filed: Jan. 22, 2018

Related U.S. Application Data

(60) Provisional application No. 62/584,927, filed on Nov. 13, 2017.

(51) Int. Cl.
*H01L 21/683* (2006.01)
*B32B 43/00* (2006.01)
*H01L 21/67* (2006.01)
*B65H 5/28* (2006.01)
(Continued)

(52) U.S. Cl.
CPC ......... *H01L 21/67132* (2013.01); *B65H 5/28* (2013.01); *H05K 13/021* (2013.01); *H05K 13/0417* (2013.01); *H01L 2221/68318* (2013.01); *H01L 2221/68381* (2013.01); *Y10S 156/93* (2013.01); *Y10S 156/941* (2013.01); *Y10T 156/1179* (2015.01); *Y10T 156/1983* (2015.01)

(58) Field of Classification Search
CPC ......... Y10T 156/1179; Y10T 156/1983; Y10S 156/93; Y10S 156/941; H01L 2221/68318; H01L 2221/68381
See application file for complete search history.

(56) References Cited

U.S. PATENT DOCUMENTS 9,564,365 B2 * 2/2017 Grivna .................. H01L 21/78
2009/0075459 A1 * 3/2009 Sato .................. H01L 21/67132
438/464

(Continued)

FOREIGN PATENT DOCUMENTS

TW 201738951 11/2017

OTHER PUBLICATIONS

Office Action of Taiwan Counterpart Application, dated Aug. 6, 2018, pp. 1-5.

*Primary Examiner* — Mark A Osele
(74) *Attorney, Agent, or Firm* — JCIPRNET (57) ABSTRACT

A detaping machine is adapted for removing a tape from a frame, the tape includes a wafer mounting area and a periphery area surrounding the wafer mounting area. The detaping machine includes a carrier and a detaping module. The carrier is for supporting the tape and the frame. The detaping module includes an elastic pressing device and a detaping head, wherein the periphery area of the tape is adapted to be pressed by the elastic pressing device, and the wafer mounting area of the tape is adapted to be pressed by the detaping head. A detaping method is further provided.

20 Claims, 9 Drawing Sheets

(51) Int. Cl.
*H05K 13/04* (2006.01)
*H05K 13/02* (2006.01)

(56) References Cited

U.S. PATENT DOCUMENTS

| | | | |
|---|---|---|---|
| 2011/0308738 A1* | 12/2011 | Maki | H01L 21/67132 156/756 |
| 2013/0330910 A1* | 12/2013 | Tanaka | H01L 21/6836 438/462 |

* cited by examiner

DETAPING MACHINE AND DETAPING METHOD

CROSS-REFERENCE TO RELATED APPLICATION

This application claims the priority benefit of U.S. provisional application Ser. No. 62/584,927, filed on Nov. 13, 2017. The entirety of the above-mentioned patent application is hereby incorporated by reference herein and made a part of this specification.

BACKGROUND

In some manufacturing processes (i.e. a dicing process) of a wafer die, a wafer is attached on a tape, wherein the tape is adhered to a frame. The frame and the tape are capable of temporarily fixing a position of the wafer during the wafer dicing process. After the wafer dicing process, known good dies are picked up and removed from the tape, and dies with malfunction remain on the tape. Because the frame can be reusable, the dies with malfunction need to be collected. How to remove the tape from the frame in an efficient manner is quite important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
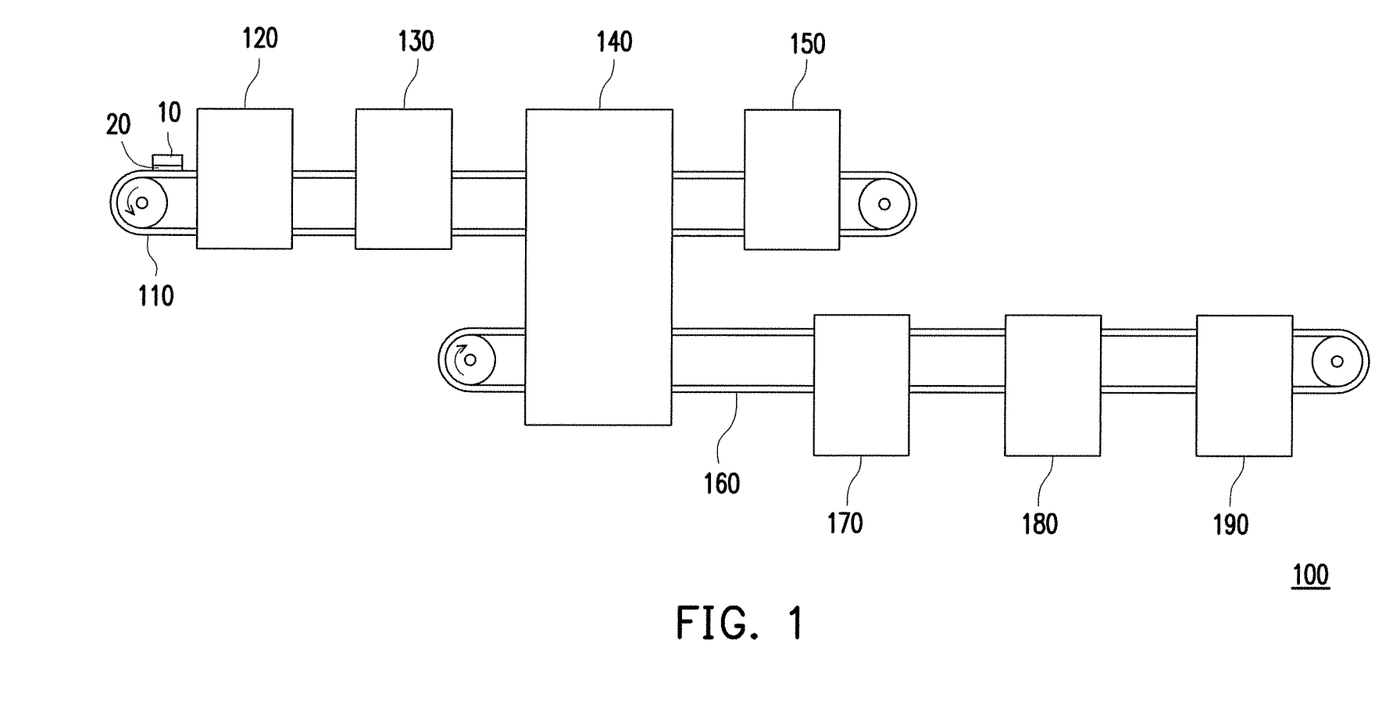
FIG. 1 is a schematic view illustrating a detaping machine in accordance with an embodiment of the present disclosure.
Figure 2:
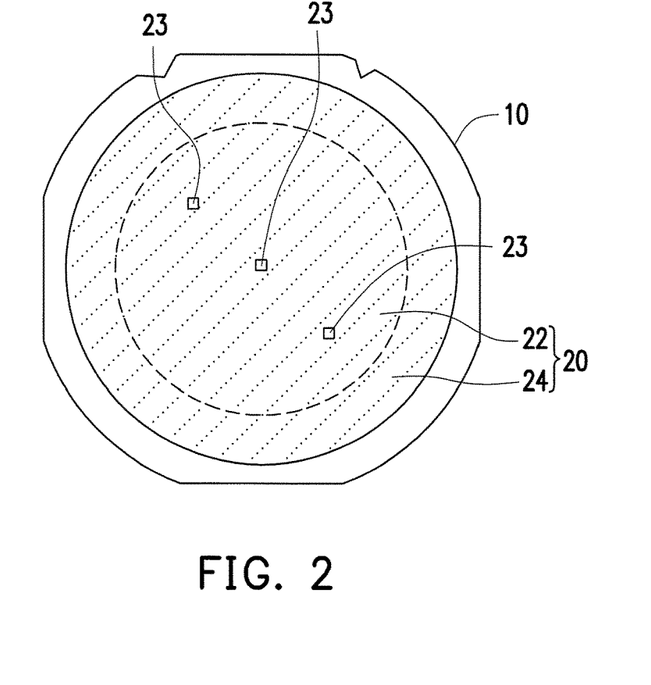
FIG. 2 is a top view illustrating a tape attached to a frame in accordance with an embodiment of the present disclosure.

FIG. 1 is a schematic view illustrating a detaping machine in accordance with an embodiment of the present disclosure. FIG. 2 is a top view illustrating a tape attached to a frame in accordance with an embodiment of the present disclosure. Referring to FIG. 1 and FIG. 2, a detaping machine 100 of the embodiment is adapted for removing a tape 20 from a frame 10. As shown in FIG. 2, the tape 20 is attached to the frame 10. In some embodiments, the frame 10 is an annular frame, the frame 10 is, for example, an annular metal frame, such as an iron annular frame. In some alternative embodiments, the frame 10 is, for example, an annular frame made by other suitable materials. The material of the frame 10 is not limited in the disclosure. The frame 10 may include an aperture (e.g., a circular aperture). In some embodiments, the tape 20 may include a base layer (not shown) and an adhesive layer (not shown) covering on the base layer. However, the type of the tape 20 is not limited thereto.

As shown in FIG. 2, the tape 20 has a sticky surface and the sticky surface faces and adheres with the frame 10. The sticky surface of the tape 20 includes an outer edge area (not shown) and the outer edge area is adhered with the frame 10. Furthermore, the sticky surface of the tape 20 further include a wafer mounting area 22 and a periphery area 24 surrounding the wafer mounting area 22. The wafer mounting area 22 and the periphery area 24 are revealed by the aperture of the frame 10. In some embodiments, after a wafer is attached onto the wafer mounting area 22 of the taped 20 carried by the frame 10, a wafer dicing process may be performed so as to form a plurality of singulated semiconductor dies attached in the wafer mounting area 22. Then, a chip-probing process or other suitable chip testing process is performed on the semiconductor dies to identify known good dies and bad dies. Thereafter, the known good dies are picked-up from the tape 20 and a series of chip package processes are performed to package the known good dies. As shown in FIG. 2, after the known good dies are picked-up, at least one bad die 23 remains on the wafer mounting area 22 of the tape 20. In FIG. 2, the number of the at least one bad die 23 is 3, for example. However, the number of the at least one bad die 23 is not limited in this disclosure.

Since the bad dies 23 attached on the tape 20 are property of wafer manufacturing company, the bad dies 23 need be returned to the wafer manufacturing company. Accordingly, the tape 20 and the bad dies 23 attached thereon need removed from the frame 10 such that the frame 10 may be recycled and used repeatedly. In some embodiments, the tape 20 having the bad dies 23 attached thereon needs to be removed from the frame 10, and after detaping the tape 20, the tape 20 and the bad dies 23 attached thereon are collected and returned to the wafer manufacturing company.

As shown in FIG. 1, in some embodiments, the detaping machine 100 includes a carrier and a detaping module 140. In some embodiments, the carrier may include a first transporting device 110 adapted to support and transport the frame 10 and the tape 20 attached on the frame 10. In some embodiments, the first transporting device 110 includes at least one conveyer belt 112. However, the type of the first transporting device 110 is not limited in this disclosure. In other embodiments, the carrier may be a supporting base. In some alternative embodiments, the first transporting device 110 may include a mechanical arm or the like.

In some embodiments, the detaping module 140 is movably disposed at a side of the first transporting device 110. The detaping module 140 is capable of moving towards the first transporting device 110 and pressing the tape 20 so as to remove the tape 20 from the frame 10.

As shown in FIG. 1 and FIG. 2, in some embodiments, the detaping machine 100 may further include a die identify module 120, a cover layer supplying module 130 and a frame collection car 150. The tape 20 attached on the frame 10 may be transported to the die identify module 120, the cover layer supplying module 130 and the detaping module 140 in sequence by the first transporting device 110. After the tape 20 is removed from the frame 10 by the detaping module 140, the frame 20 may be further transported by the first transporting device 114 and collected in the frame collection car 150. In some alternative embodiments, the detaping machine 100 may further include a die identify module 120, a cover layer supplying module 130, a frame collection car 150, a second transporting device 160, a packing device 170, a labeling device 180 and a tape collection car 190. The tape 20 attached on the frame 10 may be transported to the die identify module 120, the cover layer supplying module 130 and the detaping module 140 in sequence by the first transporting device 110. After the tape 20 is removed from the frame 10 by the detaping module 140, the frame 20 may be further transported by the first transporting device 110 and collected in the frame collection car 150. After the tape 20 is removed from the frame 10 by the detaping module 140, the tape 20 and the bad dies 23 may be further transported to the packing device 170, the labeling device 180 and the tape collection car 190 in sequence by the second transporting device 160. The die identify module 120, the cover layer supplying module 130, the detaping module 140, the frame collection car 150, the packing device 170, the labeling device 180 and the tape collection car 190 shown in FIG. 1 will be described in detail.

Figure 3:
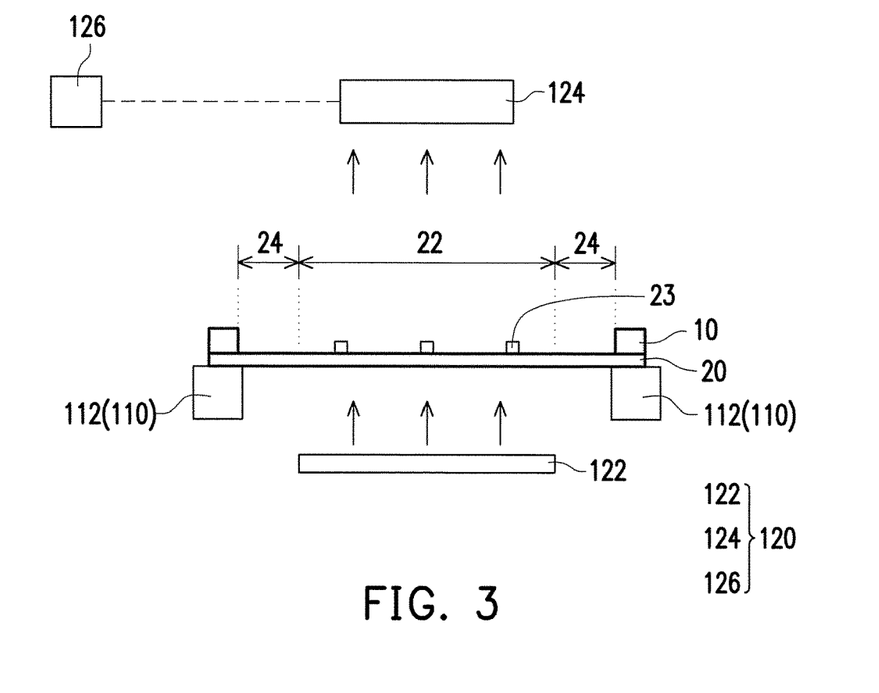
FIG. 3 is a side view illustrating a die identify module of the detaping machine in accordance with an embodiment of the present disclosure.

FIG. 3 is a side view illustrating a die identify module of the detaping machine in accordance with an embodiment of the present disclosure. Referring to FIG. 1 and FIG. 3, in some embodiments, the die identify module 120 is disposed on the transporting path of the first transporting device 110. In other words, the first transporting device 110 may transport the tape 20, the bad dies 23 and the frame 10 to the die identify module 120. The die identify module 120 is adapted to detect a die information of the at least one die 23 on the tape 20. In some embodiments, the die information includes at least one of die number information and die position information on the tape 20. That is, after performing the die identification, the die information of the at least one die 23 on the tape 20 can be gathered. The die information may be used for checking numbers of bad dies and/or checking if distributions of bad dies in different tapes 20 are similar so as to estimate if manufacturing processes of wafer need to be modified.

In some embodiments, the tape 20 is transparent or semi-transparent, and the dies 23 on the tape 20 are opaque. That is, light is capable of passing through the tape 20 and is blocked or shielded by the die 23. In some embodiments, as shown in FIG. 3, the die identify module 120 may include a light source 122, an image capturing device 124 and a processing module 126. The light source 122 is disposed at a side of the first transporting device 110 (e.g., a lower side of the first transporting device 110). The image capturing device 124 is disposed at another side of the first transporting device 110 corresponding to the light source 122 (e.g., an upper side of the first transporting device 110). In some embodiments, the first transporting device 110 comprises two conveyer belts 112 installed in parallel and the two conveyer belts 112 may move synchronously, the two conveyer belts 112 are adapted to support two opposite sides of the tape 20 and the frame 10. The frame 10, the tape 20 and the dies 23 are transported by the two conveyer belts 112.

In some embodiments, light emitted from the light source 122 may irradiate on the tape 20 and the dies 23 without being shielded by the conveyer belts 112, a part of the light emitted from the light source 122 may pass through the tape 20 and another part of the light emitted from the light source 122 may be blocked or shielded by the bad die 23 attached on the tape 20 such that a pattern or an image for identifying the number and the positions of the bad dies 23 may be captured by the image capturing device 124. For example, the image capturing device 124 includes a CCD image sensor, a CMOS image sensor or the like. In some embodiments, light emitted from the light source 122 can enhance the image quality of the pattern or image captured by the image capturing device 124.

In addition, in some embodiments, the processing module 126 is electrically connected to the image capturing device 124 and processes the data from the image capturing device 124 so as to obtain the die information. Accordingly, the die identify module 120 is capable of performing a die identify process so as to obtain the die information of the at least one die (i.e. the bad dies 23) on the tape 20. In some alternative embodiments, the light source 122 may be omitted.

It is noted that, the configuration of the die identify module 120 is not limited in this disclosure, for example, the die identify module 120 may be a metal detector which is capable of detecting metal traces in the dies 23 so as to identify the number and/or the location of the bad die 23. In some alternative embodiments, the die identify module 120 may be a height detector which is capable of detecting a height difference on the tape 20 such that the number and/or the location of the bad dies 23 may be identified.

In some embodiments, the tape 20 may have the sticky surface, in order to prevent the sticky material of the tape 20 from directly contacting the detaping module 140 during the detaping process, and/or prevent the different tapes 20 which are removed from the different frames adhering to each other while being stacked, a cover layer 131 may be provided on the tape 20 for anti-sticking before removing the tape 20 from the frame 10.

Figure 4:
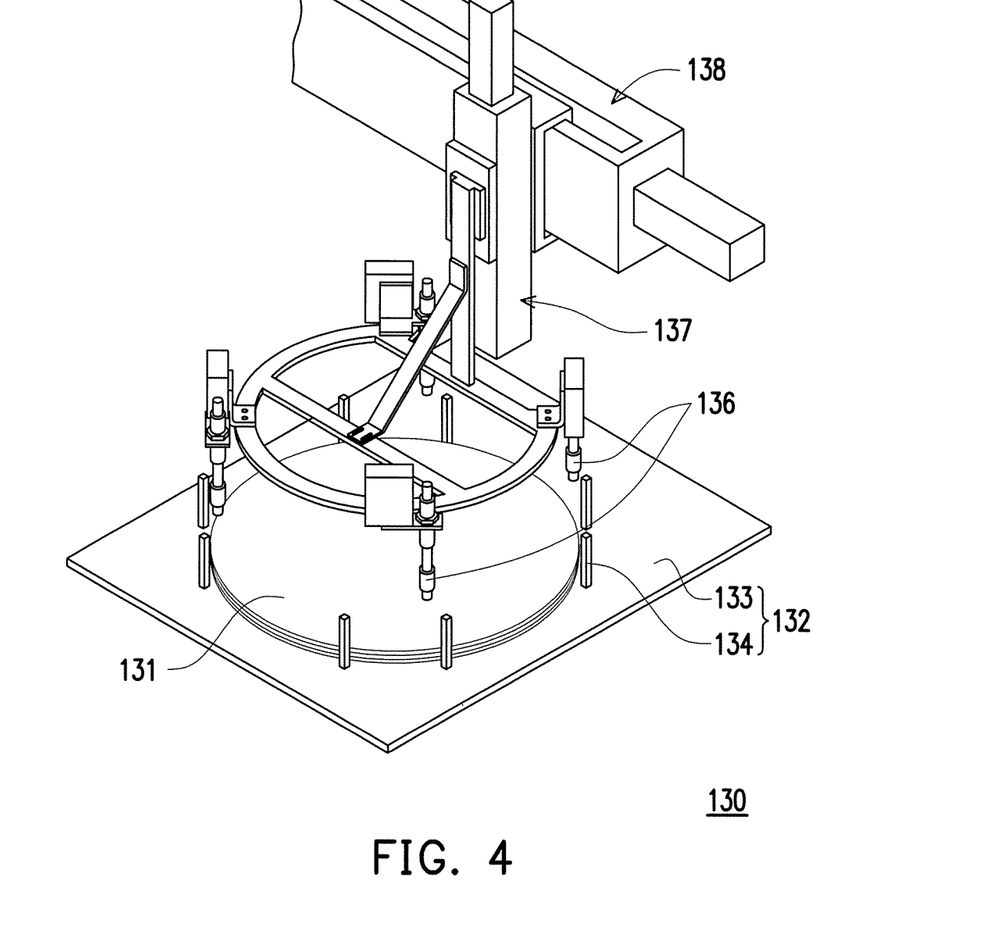
FIG. 4 is a schematic view illustrating a cover layer supplying module of the detaping machine in accordance with an embodiment of the present disclosure.
Figure 5:
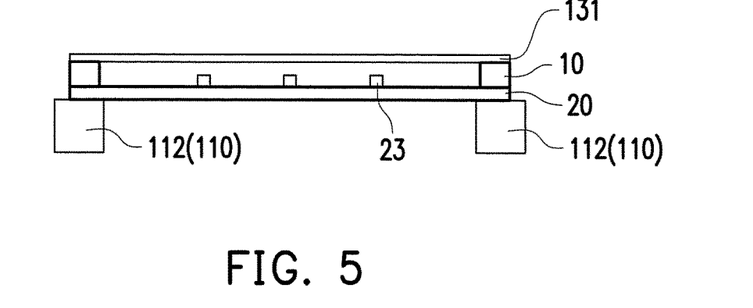
FIG. 5 is a side view illustrating the tape attached to the frame of FIG. 3 covered by a cover layer in accordance with an embodiment of the present disclosure.

FIG. 4 is a schematic view illustrating a cover layer supplying module of the detaping machine in accordance with an embodiment of the present disclosure. FIG. 5 is a side view illustrating the tape attached to the frame of FIG. 3 covered by a cover layer in accordance with an embodiment of the present disclosure. Referring to FIG. 1, FIG. 4 and FIG. 5, in some embodiments, the cover layer supplying module 130 is disposed on the transporting path of the first transporting device 110. The cover layer supplying module 130 is adapted to store a plurality of stacked cover layers 131 and provide one of the cover layers 131 on the tape 20 so as to cover the tape 20 and the bad dies 23. In some embodiments, the cover layer 131 is paper, for example. However, the type of the cover layer 131 is not limited in the disclosure. In some alternative embodiments, the cover layer 131 may be a flexible layer, e.g., a plastic tape layer, a cloth or the like.

As shown in FIG. 4, in some embodiments, the cover layer supplying module 130 includes a cover layer storage 132 and a transfer device. The cover layer storage 132 is capable of storing the plurality of stacked cover layers 131. In some embodiments, the cover layer storage 132 includes a bottom plate 133 and a plurality of posts 134 protruding from the bottom plate 133. The bottom plate 133 supports the plurality of stacked cover layers 131 and the plurality of stacked cover layers 131 is confined by the plurality of posts 134. In other words, an accommodating space for storing the plurality of stacked cover layers 131 is defined by the bottom plate 133 and the posts 134. However, the type of the cover layer storage 132 is not limited in the disclosure. In some alternative embodiments, the cover layer storage 132 may be a tank or the like.

In some embodiments, the transfer device includes at least one suction nozzle 136, a first moving device 137 connected to the at least one suction nozzle 136 and a second moving device 138 connected to the first moving device 137. In some embodiments, the transfer device may include four suction nozzles 136. However, the number of the suction nozzle 136 is not limited in the disclosure. In some embodiments, one of the cover layers 131 can be temporarily picked up by the at least one suction nozzle 136 through vacuum suction. However, the type of the transfer device is not limited in the disclosure. In some alternative embodiments, the transfer device may include a clamp (not shown) to pick up the cover layer 131.

The suction nozzles 136 may be driven to move along various directions through the first moving device 137 and the second moving device 138 such that the cover layer 131 may be picked-up by the suction nozzles 136 and may be transferred to the tape 20 attached on the frame 10. In some embodiments, the first moving device 137 may be adapted to move vertically (i.e. downwardly and upwardly) and the second moving device 138 may be adapted to move horizontally. However, the moving directions of the first moving device 137 and the second moving device 138 are not limited in the disclosure. In some embodiments, the first moving device 137 and the second moving device 138 may include sliding rails and sliders, respectively. Certainly, the types of the first moving device 137 and the second moving device 138 are not limited in the disclosure. In some alternative embodiments, the first moving device 137 and the second moving device 138 may be mechanical arms.

As shown in FIGS. 4 and 5, in some embodiments, the first transporting device 110 may transport the tape 20, the bad dies 23 and the frame 10 to the cover layer supplying module 130. Through the first moving device 137 and the second moving device 138, the suction nozzles 136 is driven to pick-up and transfer one of the stacked cover layers 131 from the cover layer storage 132 onto the tape 20 before the detaping process. The cover layer 131 picked-up by the suction nozzles 136 may be pressed onto the tape 20 such that the bad dies 23 are sandwiched between the cover layer 131 and the taper 20. For example, the cover layer 131 is adhered with the sticky surface of the tape 20 when being pressed onto the tape 20 such that the bad dies 23 attached in the tape 20 may be covered by the cover layer 131.

Figure 6:
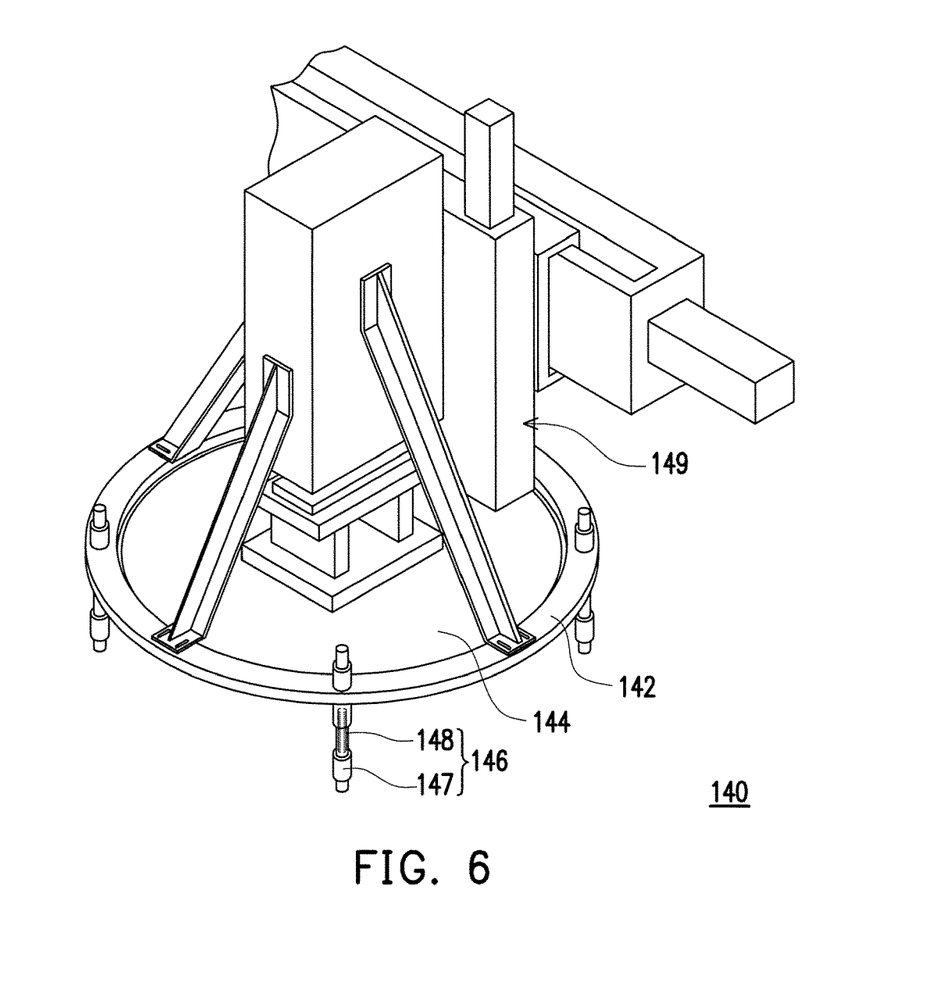
FIG. 6 is a schematic view illustrating a detaping module of the detaping machine in accordance with an embodiment of the present disclosure.

FIG. 6 is a schematic view illustrating a detaping module of the detaping machine in accordance with an embodiment of the present disclosure. Referring FIG. 1 and FIG. 6, the detaping module 140 is disposed on the transporting path of the first transporting device 110, and the detaping module 140 is adapted to press or punch the tape 20 so as to remove the tape 20 from the frame 10. In some embodiments, the detaping module 140 includes a first pressing part and a second pressing part. The first pressing part may move relative to the second pressing part, and the first pressing part and the second pressing part are adapted to press different portions of the tape attached on the frame respectively. For example, the first pressing part may be a detaping head 144, the second pressing part may be an elastic pressing device 146, and the elastic pressing device 146 may be disposed around the detaping head 144 and adapted to be deformed. In some embodiments, positions of the detaping head 144 and the elastic pressing device 146 correspond to positions of the wafer mounted area 22 and the periphery area 24. However, the type and the disposition of the first pressing part and the second pressing part are not limited in the disclosure.

As shown in FIG. 6, in some embodiments, the detaping module 140 includes an annular base 142, the detaping head 144 is surrounded by the annular base 142, and the elastic pressing device 146 is disposed at the annular base 142 and protruding from a lower surface of the annular base 142. In some embodiments, the elastic pressing device 146 includes a plurality of pressing pins 147 and a plurality of elastic members 148, and the elastic members 148 are disposed between the annular base 142 and the pressing pins 147, respectively. In other words, protruding heights of the pressing pins 147 from the annular base 142 are capable of being changed while the pressing pins 147 are pressed onto the tape 20. In some embodiments, the elastic members 148 may be springs. However, the type of the elastic members 148 is not limited in the disclosure.

It is noted that, the number of the elastic pressing device 146 is four in FIG. 6. However, the number of the elastic pressing device 146 is not limited in the disclosure. In some alternative embodiments, the number of the elastic pressing device 146 may be one, and the shape of the elastic pressing device 146 may be similar to the annular base 142. That is, the elastic pressing device 146 may be an annular protrusion, e.g., an enclosing wall protruding from the lower surface of the annular base 142. Certainly, the shape of the elastic pressing device 146 is not limited in the disclosure. In addition, in some embodiments, a third moving device 149 is connected to the detaping module 140. The detaping module 140 may be moved by the third moving device 14 vertically (i.e. downwardly and upwardly) so as to perform the detaping process.

Figure 7:
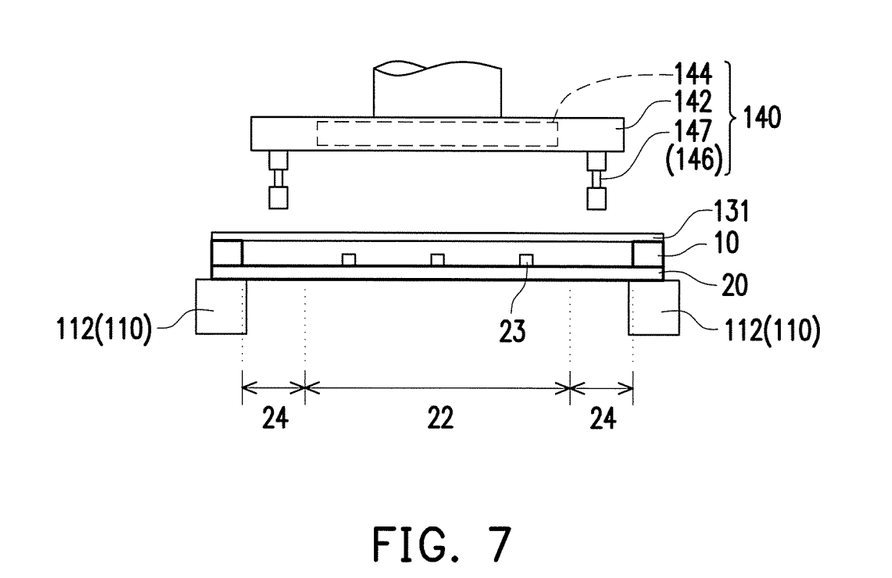
FIGS. 7, 8, 9, and 10A are side views illustrating a detaping process by the detaping module of FIG. 6 in accordance with an embodiment of the present disclosure.

FIGS. 7-10A are side views illustrating a detaping process by the detaping module of FIG. 6 in accordance with an embodiment of the present disclosure. FIGS. 10B and 10C are flow charts of detaping processes in accordance with some embodiments of the present disclosure, respectively. Referring FIG. 7 first, in some embodiments, the first transporting device 110 may further transport the tape 20, the bad dies 23, the frame 10 and the cover layer 131 to the detaping module 140. As shown in FIGS. 7, 10B and 10C, the frame 10 with the tape 20 is provided on the carrier, wherein the tape 20 includes the wafer mounting area 22 and the periphery area 24 surrounding the wafer mounting area 22 (a step 210 shown in FIGS. 10B and 10C). In some embodiments, after the step 210, the cover layer 131 may be provided on the tape 20 (as a step 215 shown in FIG. 10B). As shown in FIG. 7, the detaping module 140 may be located above the tape 20, the bad dies 23, the frame 10, the cover layer 131 and the first transporting device 110. However, the disposition of the detaping module 140 is not limited in the disclosure. In addition, in some embodiments, positions of the detaping head 144 and the elastic pressing device 146 of the detaping module 140 correspond to positions of the wafer mounting area 22 and the periphery area 24 of the tape 20, respectively.

As shown in FIG. 7, the detaping head 144 is located at an initial position relative to the elastic pressing device 146. In some embodiments, at the initial position, the detaping head 144 may be located at the same level height as the annular base 142. The pressing pins 147 may protrude from the lower surface of the annular base 142, so that a shortest distance between the elastic pressing device 146 and the tape 20 is less than a shortest distance between the detaping head 144 and the tape 20. However, the positions of the detaping head 144 and the annular base 142 in the initial position are not limited in the disclosure. In some alternative embodiments, the detaping head 144 may be located higher than or lower than the level height of the annular base 142 in the initial position.

Figure 8:
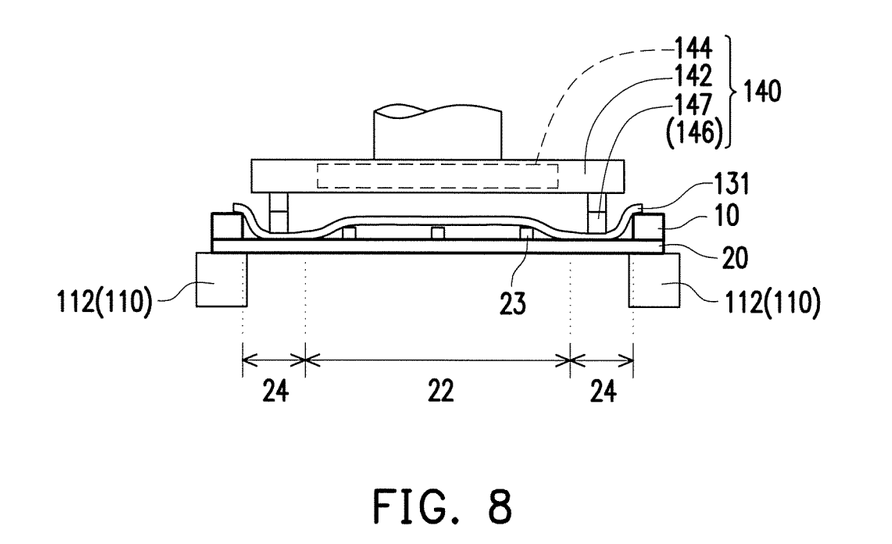

Referring FIG. 8, in some embodiments, a first pressing procedure of the detaping process is performed by the elastic pressing device 146 of the detaping module 140. During the first pressing procedure, the detaping module 140 may move towards the tape 20 until the periphery area 24 of the tape 20 and a portion of the cover layer 131 corresponding to the periphery area 24 of the tape 20 are pre-pressed by the elastic pressing device 146 of the detaping module 140 (as a step 225 shown in FIG. 10B). In some embodiments, the cover layer 131 may be omitted, in that way, the first pressing procedure of the detaping process may include a step 220 of FIC. 10C. In step 220, the periphery area 24 of the tape 20 is pre-pressed through the elastic pressing device 146 of the detaping module 140. During the first pressing procedure, the elastic members 148 of the elastic pressing device 146 may be deformed when the pressing pins 147 press the periphery area 24 of the tape 20, so that the pressing pins 147 may pre-press the periphery area 24 of the tape 20. A portion of the outer edge area of the sticky surface of the tape 20 may be separated slightly from the frame 10 during the first pressing procedure.

Figure 9:
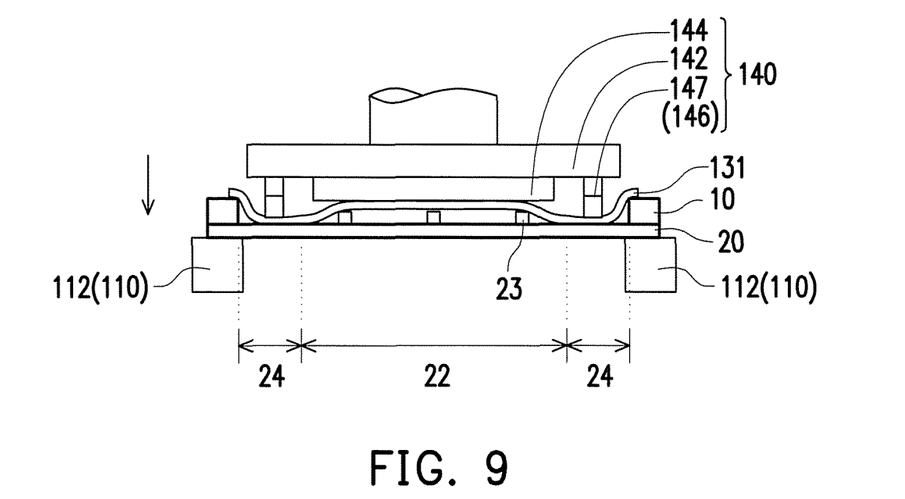
Figure 10A:
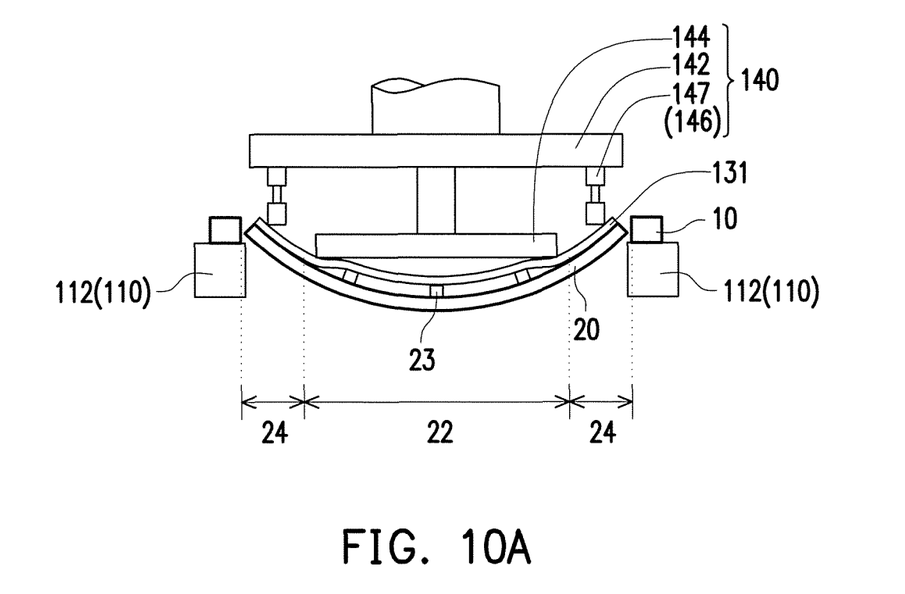
Figure 10B:
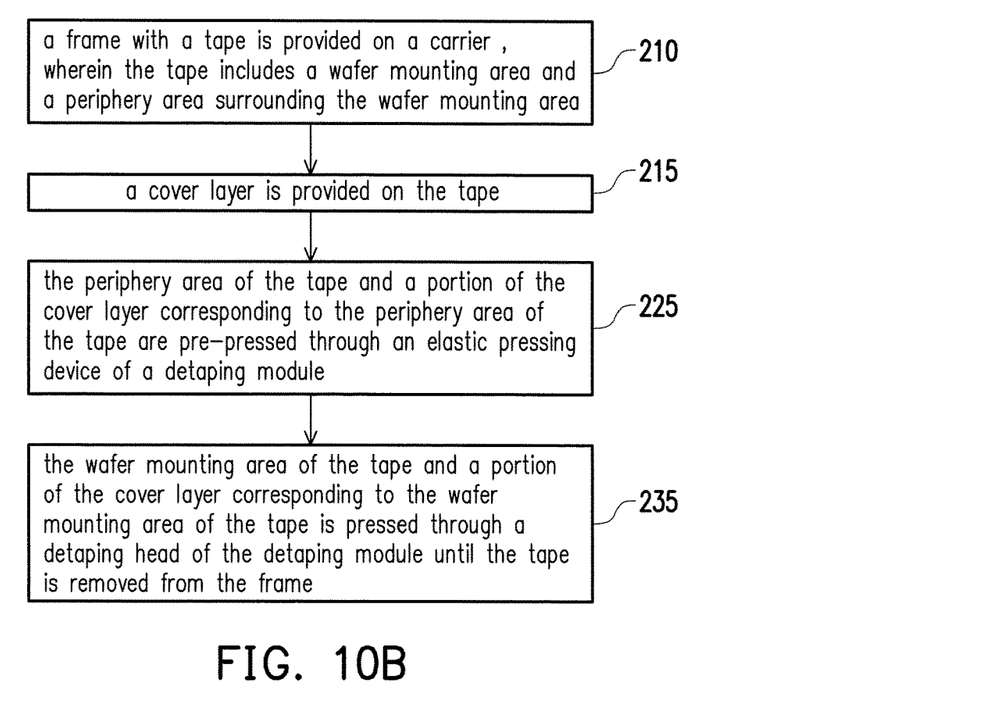
FIGS. 10B and 10C are flow charts of detaping processes in accordance with some embodiments of the present disclosure, respectively.
Figure 10C:
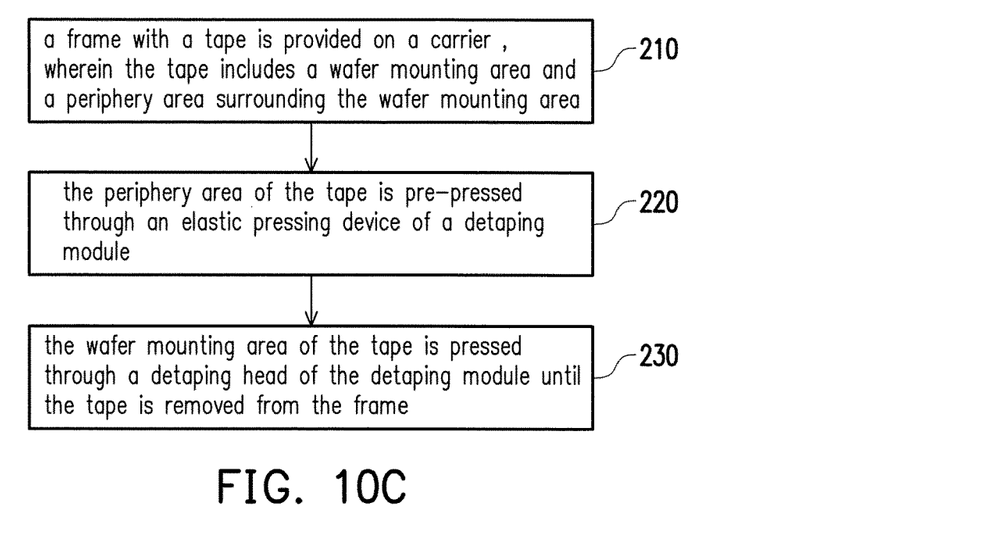

Then, referring FIG. 9 and FIG. 10A, a second pressing procedure of the detaping process is performed by the detaping head 144 of the detaping module 140. During the second pressing procedure, the detaping head 144 is moved relative to the elastic pressing device 146 to a detaping position (as shown in FIG. 10A). In a step 235 shown in FIG. 10B, the wafer mounting area 22 of the tape 20 and a portion of the cover layer 131 corresponding to the wafer mounting area 22 of the tape 20 are pressed through the detaping head 144 of the detaping module 140 until the tape 20 is removed from the frame 10. Hence, after the step 235, the tape 20 is separated from the frame 10 completely. In some embodiments, the cover layer 131 may be omitted, in that way, the second pressing procedure of the detaping process may include a step 230 shown in FIG. 10C, the wafer mounting area 22 of the tape 20 is pressed through the detaping head 144 of the detaping module 140 until the tape 20 is removed from the frame 10.

As shown in FIG. 10A, in some embodiments, when the detaping head 144 is located at the detaping position, a bottom surface of the detaping head 144 is located at a lower level height than the annular base 142 and the elastic pressing device 146. That is, a moving distance of the detaping head 144 from the initial position (as shown in FIG. 7) to the detaping position (as shown in FIG. 10A) is greater than the amount of deformation of the elastic pressing device 146. In addition, when the detaping head 144 is located at the detaping position, a bottom surface of the detaping head 144 may be lower than the frame 10, so that the tape 20, the bad dies 23 remained on the tape 20 and the cover layer 131 covering the tape 20 may be pressed through the aperture of the frame 10 and the space between the two conveyer belts 112 after the detaping process.

In some embodiments, the force applied to the periphery area 24 of the tape 20 by the elastic pressing device 146 in the first pressing procedure of the detaping process may be less than force applied to the wafer mounting area 22 of the tape 20 by the detaping head 144 in the second pressing procedure of the detaping process. In some embodiments, the first pressing procedure is applied on the periphery area 24 of the tape 20 so as to provide the pre-pressing pressure to the periphery area 24 of the tape 20 in advance. In that way, the portion of the outer edge of the sticky surface of the tape 20 may be slightly separated from the frame 10 in the first pressing procedure. After that, the second pressing procedure is applied on the wafer mounting area 22 of the tape 20 until the outer edge of the sticky surface of the tape 20 is separated from the frame 10 completely. The tape 20 removed from the frame 10 may not be torn or broken easily after performing the two steps pressing procedures of the detaping process.

Certainly, in some alternative embodiments, the force applied to the periphery area 24 of the tape 20 by the elastic pressing device 146 in the first pressing procedure of the detaping process may be substantially equal to or larger than the force applied to the wafer mounting area 22 of the tape 20 by the detaping head 144 in the second pressing procedure of the detaping process. In addition, in some alternative embodiments, the first and the second pressing procedures can be performed at the same time.

Figure 11:
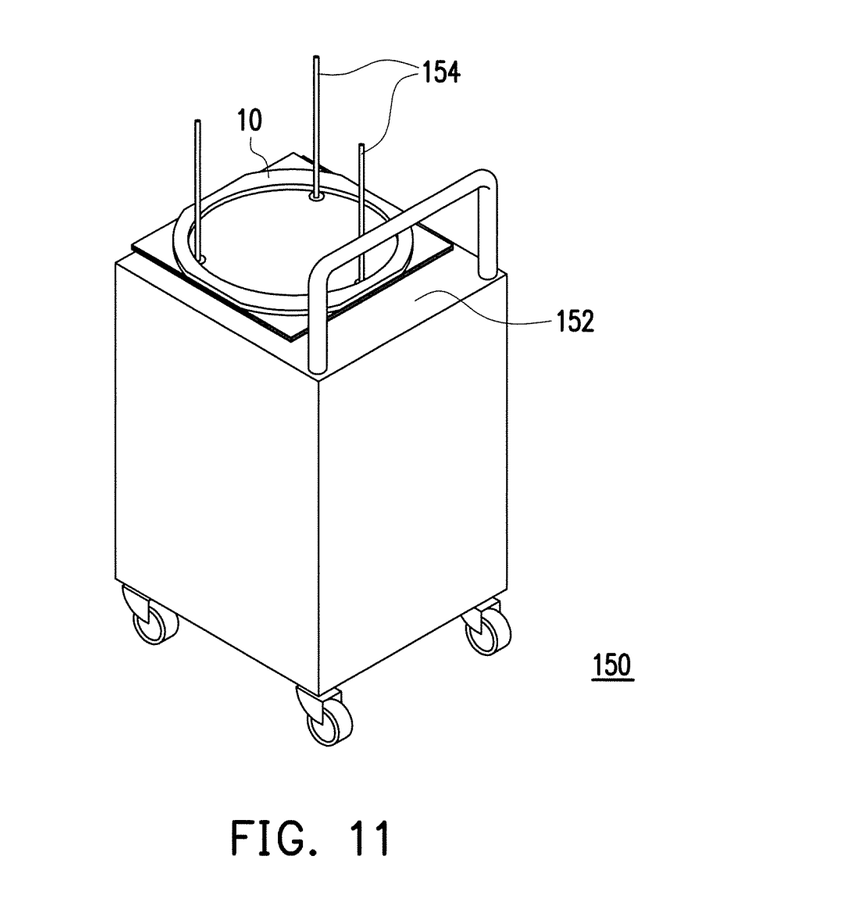
FIG. 11 is a schematic view illustrating a frame collection car of the detaping machine in accordance with an embodiment of the present disclosure.

FIG. 11 is a schematic view illustrating a frame collection car of the detaping machine in accordance with an embodiment of the present disclosure. Referring FIG. 1 and FIG. 11, the frame collection car 150 is disposed on the transporting path of the first transporting device 110. After the detaping process, the tape 20 and the bad dies 23 are separated from the frame 10, and the frame 10 may be transported to the frame collection car 150 by the first transporting device 110 for reuse. In some embodiments, the frame collection car 150 may include a main body 152, a plurality of the posts 154 protruding from an upper surface of the main body 152 and a plurality of wheels rotatably disposed at a bottom of the main body 152. As shown in FIG. 11, when the frame 10 is stored in the frame collection car 150, the posts 154 may pass through the aperture of the frame 10 so that the frame 10 may be temporarily fixed in the frame collection car 150. Specifically, when the frame 10 is stored in the frame collection car 150, horizontal movements of the frame 10 may be limited by the posts 154. Of course, the type of the frame collection car 150 is not limited in the disclosure. In other embodiment, the frame collection car 150 may be a tank for storing the frame 10.

Figure 12:
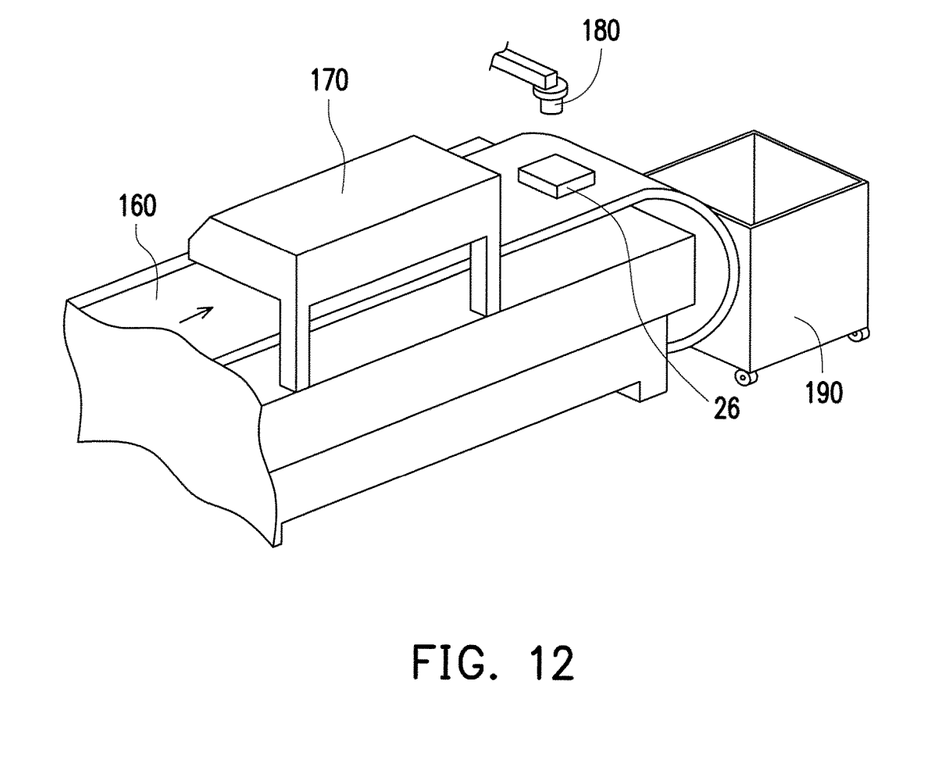
FIG. 12 is a schematic view illustrating a packing device, a printing device and a tape collection car of the detaping machine in accordance with an embodiment of the present disclosure.

FIG. 12 is a schematic view illustrating a packing device, a printing device and a tape collection car of the detaping machine in accordance with an embodiment of the present disclosure. Referring FIG. 1 and FIG. 12, in some embodiments, the detaping module 140 may be disposed at a side of the transporting path of the second transporting device 160. For example, a part of the second transporting device 160 may be located at a position beside the detaping module 140 and face the detaping head 144. After performing the detaping process, the tape 20, the bad dies 23 attached on the tape 20 and the cover layer 131 may be removed from the frame 10 and may be pushed toward the second transporting device 160 by the detaping module 140.

In some embodiments, the detaping module 140 may be disposed above the transporting path of the second transporting device 160, and the tape 20, the bad dies 23 and the cover layer 131 may drop to the second transporting device 160 after separated from the frame 10. After that, the tape 20, the bad dies 23 and the cover layer 131 may be transported to the packing device 170 by the second transporting device 160. In addition, in some embodiments, the second transporting device 160 includes a conveyer belt 112. However, the type of the second transporting device 160 is not limited in the disclosure. In some alternative embodiments, the second transporting device 160 may be a mechanism arm or the like.

In some embodiments, the tape 20, the bad dies 23 and the cover layer 131 may be packed to a bad die packing 26 by the packing device 170. In some alternative embodiments, the cover layer 131 may be removed before performing the packing process. That is, the cover layer 131 may not remain in the bad die packing 26. Certainly, in some alternative embodiments, the bad dies may be picked up from the tape 20 and then be packed to the bad die packing 26.

After the packing process, the bad die packing 26 may be transported to the labeling device 180 by the second transporting device 160. The labeling device 180 is adapted to label bad die packing 26 or print a barcode such as some information on the bad die packing 26 for identification and management. Of course, in some alternative embodiments, the labeling process may be omitted. Finally, the bad die packing 26 may be transported to the tape collection car 190 by the second transporting device 160.

Therefore, the detaping machine 100 of some embodiments is capable of removing the tape 20 from the frame 10 efficiently and automatically. In addition, due to the design of the detaping module 140 and the detaping process applied by the detaping module 140, possibility of the tape 20 which is torn or broken during the detaping process can be reduced. Moreover, the die information of the at least one bad die 23 remained on the tape 20 may be gathered by the die identify module 120 of the detaping machine 100 easily and automatically, so that the error rate of identification the die information can be reduced. Furthermore, in some embodiments, the cover layer supplying module 130 of the detaping machine 100 may provide the cover layer 131 on the tape 20 so as to prevent the tapes 20 are adhered to each other and/or adhered to the detaping module 140. In addition, after the detaping process, the tape 20 and the at least one bad die 23 remained on the tape 20 may be packed and labeled before being returned to the wafer manufacturing company, the packing process and labeling process may facilitate management of the bad dies 23.

In accordance with some embodiments of the disclosure, a detaping machine is adapted for removing a tape from a frame, the tape includes a wafer mounting area and a periphery area surrounding the wafer mounting area. The detaping machine includes a carrier and a detaping module. The carrier is for supporting the tape and the frame. The detaping module includes an elastic pressing device and a detaping head, wherein the periphery area of the tape is adapted to be pressed by the elastic pressing device, and the wafer mounting area of the tape is adapted to be pressed by the detaping head.

In accordance with some alternative embodiments of the disclosure, a detaping method includes: providing a frame with a tape on a carrier, wherein the tape has a wafer mounting area and a periphery area surrounding the wafer mounting area; pre-pressing the periphery area of the tape through an elastic pressing device of a detaping module; and pressing the wafer mounting area of the tape through a detaping head of the detaping module until the tape is removed from the frame.

In accordance with some embodiments of the disclosure, a detaping method includes: providing a frame with a tape on a carrier, wherein the tape includes a wafer mounting area and a periphery area surrounding the wafer mounting area; providing a cover layer on the tape; pre-pressing the periphery area of the tape and a portion of the cover layer corresponding to the periphery area of the tape through an elastic pressing device of a detaping module; and pressing the wafer mounting area of the tape and a portion of the cover layer corresponding to the wafer mounting area of the tape through a detaping head of the detaping module until the tape is removed from the frame.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A detaping machine for removing a tape from a frame, the tape comprising a wafer mounting area and a periphery area surrounding the wafer mounting area, the detaping machine comprising:
    a carrier for supporting the tape and the frame; and
    a detaping module comprising an elastic pressing device and a detaping head, wherein the periphery area of the tape is adapted to be pressed by the elastic pressing device, and the wafer mounting area of the tape is adapted to be pressed by the detaping head.

2. The detaping machine according to claim 1, wherein the detaping head is adapted to move towards the tape from an initial position to a detaping position, and a shortest distance between the elastic pressing device and the tape is less than a shortest distance between the detaping head and the tape when the detaping head is located at the initial position.

3. The detaping machine according to claim 1, wherein the detaping module comprises an annular base, the detaping head is surrounded by the annular base, the elastic pressing device is disposed on the annular base and comprises a plurality of pressing pins and a plurality of elastic members, and the elastic members are disposed between the annular base and the pressing pins.

4. The detaping machine according to claim 1, further comprising:
a die identify module adapted to identify a die information of at least one die attached on the wafer mounting area of the tape.

5. The detaping machine according to claim 4, wherein the die identify module comprises:
a light source; and
an image capturing device, disposed at a side of the light source, wherein the tape is adapted to be disposed between the light source and the image capturing device, and the image capturing device is adapted to capture an image of the tape and the at least one die attached on the wafer mounting area of the tape.

6. The detaping machine according to claim 1, wherein the carrier comprises a first transporting device, the detaping module is disposed on a transporting path of the first transporting device, the first transporting device comprises two conveyer belts installed in parallel, and the two conveyer belts are adapted to support the frame and the tape.

7. The detaping machine according to claim 1, further comprising:
a cover layer supplying module, wherein a plurality of cover layers are stored in the cover layer supplying module.

8. The detaping machine according to claim 7, wherein the cover layer supplying module comprises a storage for storing the cover layers and a transfer device for transferring one of the cover layers from the storage to the tape, the storage comprises a bottom plate and a plurality of posts protruding from the bottom plate.

9. The detaping machine according to claim 1, further comprising:
a second transporting device, disposed at a side of the detaping module and adapted to transport the tape removed from the frame; and
a packing device, wherein the second transporting device transports the tape removed from the frame to the packing device, and the packing device is adapted to package the tape.

10. A detaping method, comprising:
providing a frame with a tape on a carrier, wherein the tape comprises a wafer mounting area and a periphery area surrounding the wafer mounting area;
pre-pressing the periphery area of the tape through an elastic pressing device of a detaping module; and
pressing the wafer mounting area of the tape through a detaping head of the detaping module until the tape is removed from the frame.

11. The detaping method according to claim 10, wherein a moving distance of the detaping head is greater than an amount of deformation of the elastic pressing device.

12. The detaping method according to claim 10, wherein a force applied to the periphery area of the tape by the elastic pressing device of the detaping module is less than a force applied to the wafer mounting area of the tape by the detaping head of the detaping module.

13. The detaping method according to claim 10, wherein the detaping module comprises an annular base, the detaping head is surrounded by the annular base, the elastic pressing device is disposed on the annular base and comprises a plurality of pressing pins and a plurality of elastic members, the elastic members are disposed between the annular base and the pressing pins, and the plurality of elastic members are deformed while pre-pressing the periphery area of the tape.

14. The detaping method according to claim 10, further comprising:
before pre-pressing the periphery area of the tape, performing a die identify process by a die identify module so as to identify at least one die attached on the wafer mounting area of the tape and obtain a die information of the at least one die attached on the wafer mounting area of the tape.

15. The detaping method according to claim 10, further comprising:
after removing the tape from the frame, packaging the tape removed from the frame.

16. A detaping method, comprising:
providing a frame with a tape on a carrier, wherein the tape comprises a wafer mounting area and a periphery area surrounding the wafer mounting area;
providing a cover layer on the tape;
pre-pressing the periphery area of the tape and a portion of the cover layer corresponding to the periphery area of the tape through an elastic pressing device of a detaping module; and
pressing the wafer mounting area of the tape and a portion of the cover layer corresponding to the wafer mounting area of the tape through a detaping head of the detaping module until the tape is removed from the frame.

17. The detaping method according to claim 16, wherein a moving distance of the detaping head is greater than the amount of deformation of the elastic pressing device, and a force applied to the periphery area of the tape by the elastic pressing device of the detaping module is less than a force applied to the wafer mounting area of the tape by the detaping head of the detaping module.

18. The detaping method according to claim 16, wherein the detaping module comprises an annular base, the detaping head is surrounded by the annular base, the elastic pressing device is disposed on the annular base and comprises a plurality of pressing pins and a plurality of elastic members, the elastic members are disposed between the annular base and the pressing pins, and the plurality of elastic members are deformed while pre-pressing the periphery area of the tape.

19. The detaping method according to claim 16, further comprising:
before pre-pressing the periphery area of the tape, performing a die identify process by a die identify module so as to identify at least one die attached on the wafer mounting area of the tape and obtain a die information of the at least one die attached on the wafer mounting area of the tape.

20. The detaping method according to claim 19, wherein the die identify process further comprising:
placing the frame and the tape between a light source and an image capturing device of the die identify module; and
capturing an image of light emitted from the light source and passing through the tape by the image capturing device.

* * * * *